United States Patent
Hill

(10) Patent No.: US 7,032,193 B1
(45) Date of Patent: Apr. 18, 2006

(54) DIFFERENTIALLY MIS-ALIGNED CONTACTS IN FLASH ARRAYS TO CALIBRATE FAILURE MODES

(75) Inventor: W. Eugene Hill, Moss Beach, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 298 days.

(21) Appl. No.: 10/320,910

(22) Filed: Dec. 17, 2002

Related U.S. Application Data

(60) Provisional application No. 60/415,210, filed on Sep. 30, 2002.

(51) Int. Cl.
G06F 17/50 (2006.01)

(52) U.S. Cl. .................. 716/4; 716/5; 716/19

(58) Field of Classification Search ............... 716/4–5, 716/19; 438/14–15, 18, 200, 257, 657; 702/42, 702/57, 85, 108; 324/765; 714/42, 718
See application file for complete search history.

(56) References Cited

U.S. PATENT DOCUMENTS

| | | | | |
|---|---|---|---|---|
| 5,675,177 A * | 10/1997 | Abys et al. ............. | 257/666 |
| 5,687,178 A * | 11/1997 | Herr et al. ............. | 714/721 |
| 5,691,216 A * | 11/1997 | Yen et al. .............. | 438/275 |
| 5,726,920 A * | 3/1998 | Chen et al. ............ | 702/108 |
| 6,034,384 A * | 3/2000 | Kasai .................... | 257/206 |
| 6,181,154 B1 * | 1/2001 | Beffa .................... | 324/765 |
| 6,214,664 B1 * | 4/2001 | Kimura et al. ........ | 438/253 |
| 6,265,888 B1 * | 7/2001 | Hsu ...................... | 324/760 |
| 6,612,159 B1 * | 9/2003 | Knutrud ................ | 73/105 |
| 2002/0079553 A1 * | 6/2002 | Cleeves ................ | 438/637 |
| 2002/0192905 A1 * | 12/2002 | Sekiguchi et al. ..... | 438/253 |

* cited by examiner

*Primary Examiner*—Paul Dinh
(74) *Attorney, Agent, or Firm*—Winstead Sechrest & Minick P.C.

(57) ABSTRACT

A method and apparatus for calibrating failures in semiconductor memory devices due to contact mask misalignment includes: providing a plurality of semiconductor memory devices on a die; providing a contact mask with a plurality of known offsets; creating a plurality of contacts on the die using the contact mask; determining which devices on the die fail; and creating a pass/fail map for the devices. The pass/fail map can be used to determine the range of allowed misalignment and the amount of misalignment, providing a better understanding of how contact mask misalignment affects the yield and reliability of the memory devices. The pass/fail map may also be used for comparison with a pass/fail map created after the arrays have been subjected to a known stress.

7 Claims, 5 Drawing Sheets sures# DIFFERENTIALLY MIS-ALIGNED CONTACTS IN FLASH ARRAYS TO CALIBRATE FAILURE MODES This application claims the benefit of Provisional Application No. 60/415,210, filed Sep. 30, 2002.

FIELD OF THE INVENTION

The present invention relates to semiconductor memory devices, and more particularly to mis-alignments of contacts in semiconductor memory devices.

BACKGROUND OF THE INVENTION

FIG. 1 illustrates a cross-sectional view of conventional Flash memory devices. Each device comprises a floating gate stack 102 and 104. Each floating gate comprises an oxide layer 112, a first polysilicon layer 110 on the oxide layer 112, an oxide-nitride-oxide (ONO) layer 108 on the first polysilicon layer 110, and a second polysilicon layer 106 on the ONO layer 108. Each device also comprises active regions 118 and spacers 114. A contact 120 is created on the active region 118 between the two floating gate stacks 102 and 104.

FIG. 2 illustrates a surface view of arrays of conventional Flash memory devices on a die. The arrays comprise lines of polysilicon 202 along one direction on a die and lines of active regions 204 along another direction on the die. At the active regions and between two polysilicon lines 202 are the contacts 206.

A mask (not shown) is used to direct the etching of an insulator layer 122 to form a trench and for filling the trench with the contact material to form the contact 120. As the density of devices are increased for each die, the stacks 102 and 104 become closer. As the stacks 102 and 104 become closer, the allowed amount of misalignment of the mask becomes smaller. Misalignment of the mask may cause the contact 120 to touch one of the adjacent stacks 102 or 104, shorting that device. The misalignment of the mask may also cause the contact 120 to be close enough to an adjacent stack 102 or 104 to induce charge loss or gain, resulting in data loss. Thus, contact mask misalignment negatively impacts the yield and reliability of the Flash memory devices on the die.

However, it is difficult to calibrate the effects of contact mask misalignment. The amount of misalignment is difficult to determine, as is the allowable magnitude of the misalignment. Thus, the change to the manufacturing process to address the misalignment problem is difficult to ascertain.

Accordingly, there exists a need for a method and apparatus for calibrating failures in semiconductor memory devices due to contact mask misalignment. The method and apparatus should apply to Flash memory devices as well as other semiconductor memory devices. The present invention addresses such a need.

SUMMARY OF THE INVENTION

A method and apparatus for calibrating failures in semiconductor memory devices due to contact mask misalignment includes: providing a plurality of semiconductor memory devices on a die; providing a contact mask with a plurality of known offsets; creating a plurality of contacts on the die using the contact mask; determining which devices on the die fail; and creating a pass/fail map for the devices. The pass/fail map can be used to determine the range of allowed misalignment and the amount of misalignment, providing a better understanding of how contact mask misalignment affects the yield and reliability of the memory devices. The pass/fail map may also be used for comparison with a pass/fail map created after the arrays have been subjected to a known stress.

DETAILED DESCRIPTION

The present invention provides a method and apparatus for calibrating failures in semiconductor memory devices due to contact mask misalignment. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles features described herein.

To more particularly describe the features of the present invention, please refer to FIGS. 3 through 5 in conjunction with the discussion below.

Figure 1:
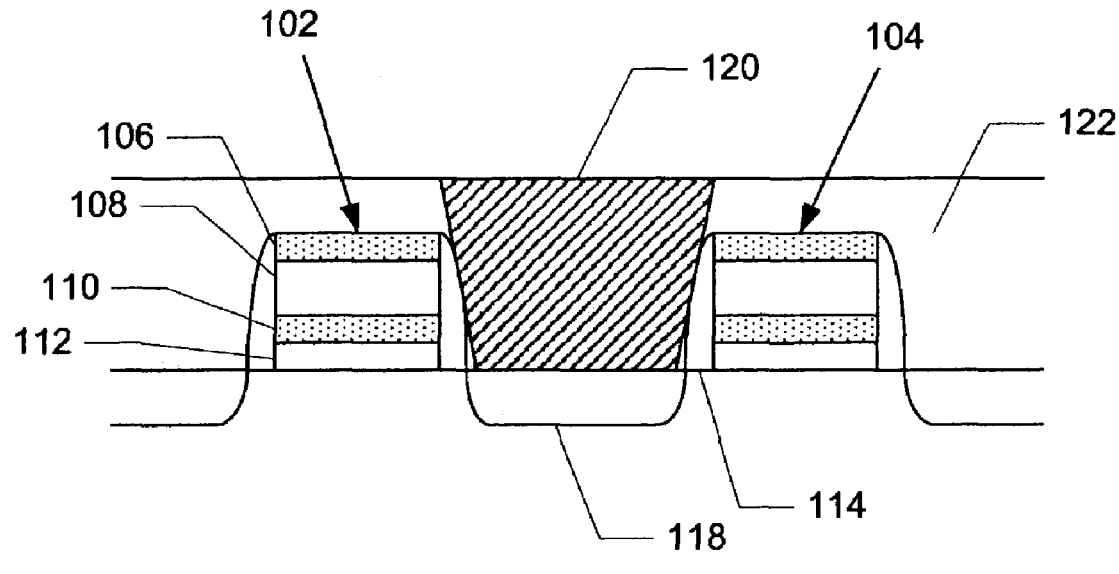
FIG. 1 illustrates a cross-sectional view of conventional Flash memory devices.
Figure 2:
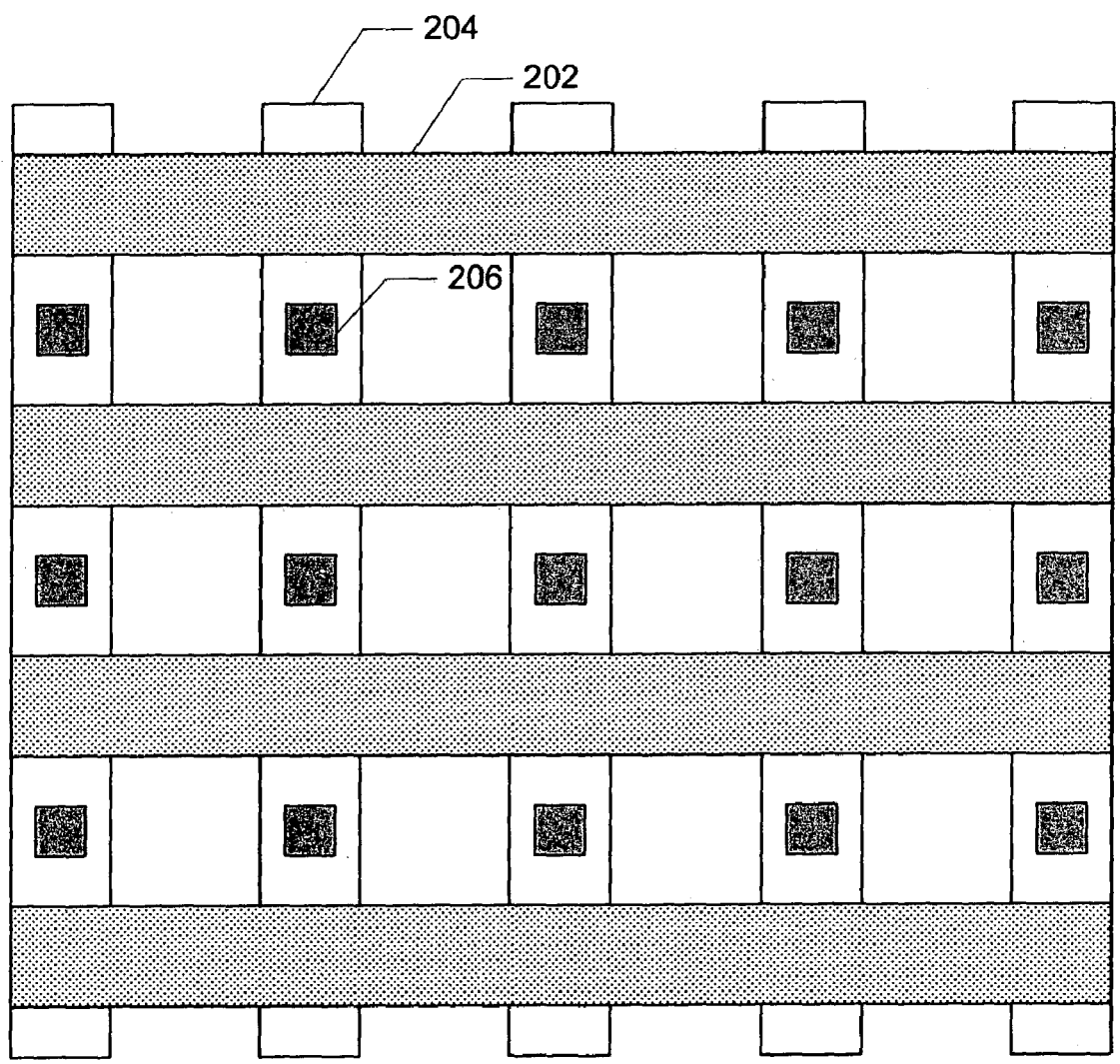
FIG. 2 illustrates a surface view of arrays of conventional Flash memory devices on a die.
Figure 3:
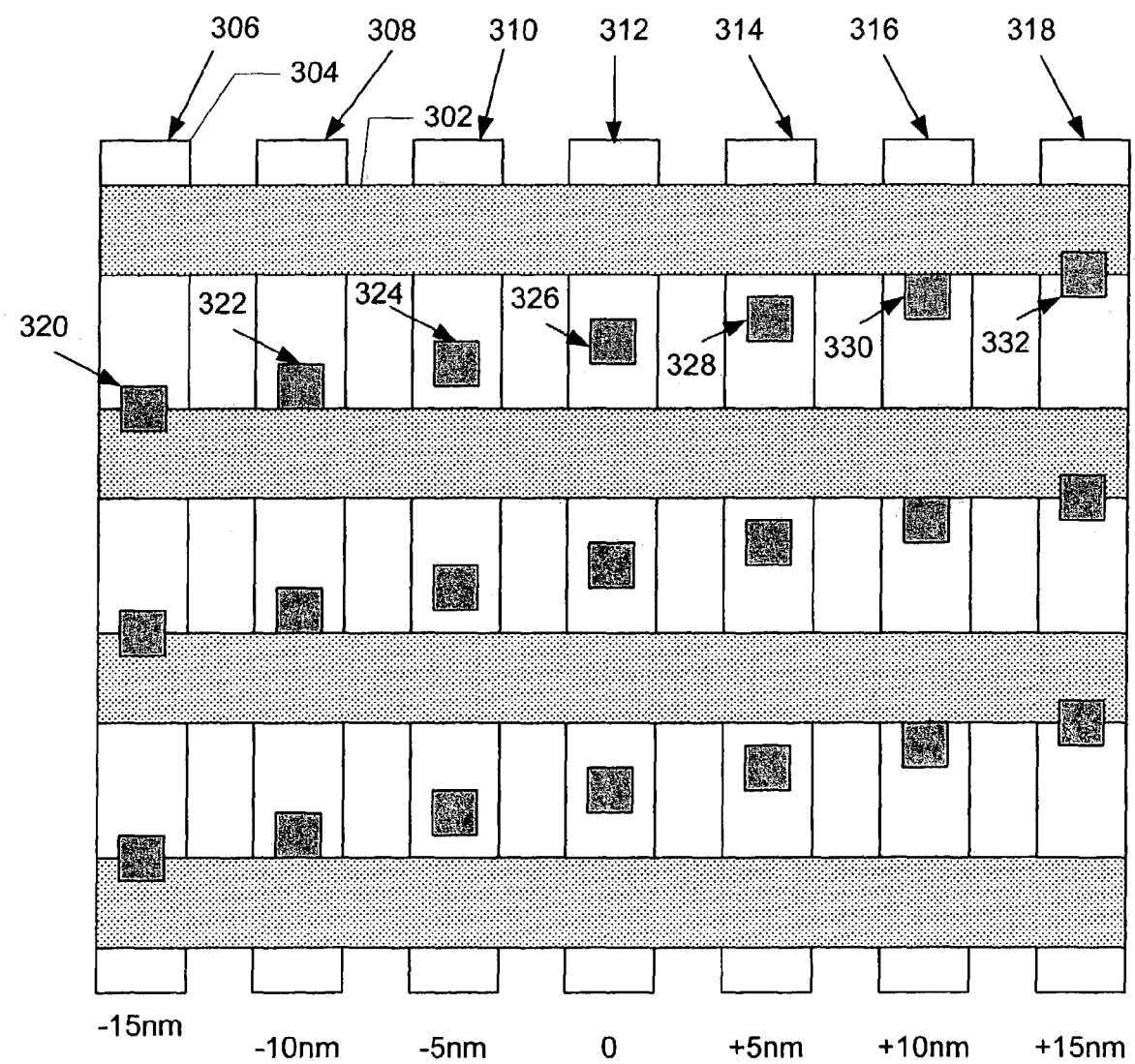
FIG. 3 illustrates a preferred embodiment of test structures for calibrating failures in semiconductor memory devices due to contact mask misalignment in accordance with the present invention.

FIG. 3 illustrates a preferred embodiment of test structures for calibrating failures in semiconductor memory devices due to contact mask misalignment in accordance with the present invention. The test structures comprise lines of polysilicon 302 along one direction on a die (not shown) and lines of active regions 304 along another direction on the die, creating arrays 306–318 of memory devices. For each array 306–318, the contact mask (not shown) is intentionally offset by a known amount. For example, the contacts 326 for array 312 has no offset; contacts 324 and 328 for arrays 310 and 314 are intentionally offset by −5 nm and +5 nm, respectively; contacts 322 and 330 for arrays 310 and 316 are intentionally offset by −10 nm and +10 nm, respectively; and contacts 320 and 332 for arrays 306 and 318 are intentionally offset by −15 nm and +15 nm, respectively.

Figure 4:
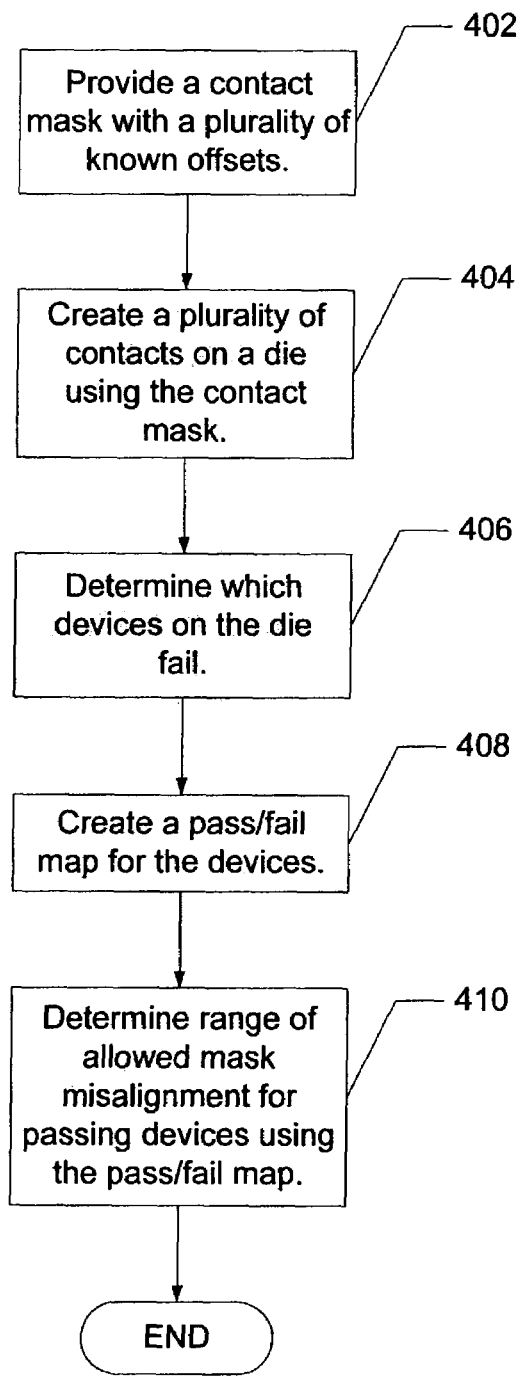
FIG. 4 is a flowchart illustrating a preferred embodiment of a method for calibrating failures in semiconductor memory devices due to contact mask misalignment in accordance with the present invention.
Figure 5:
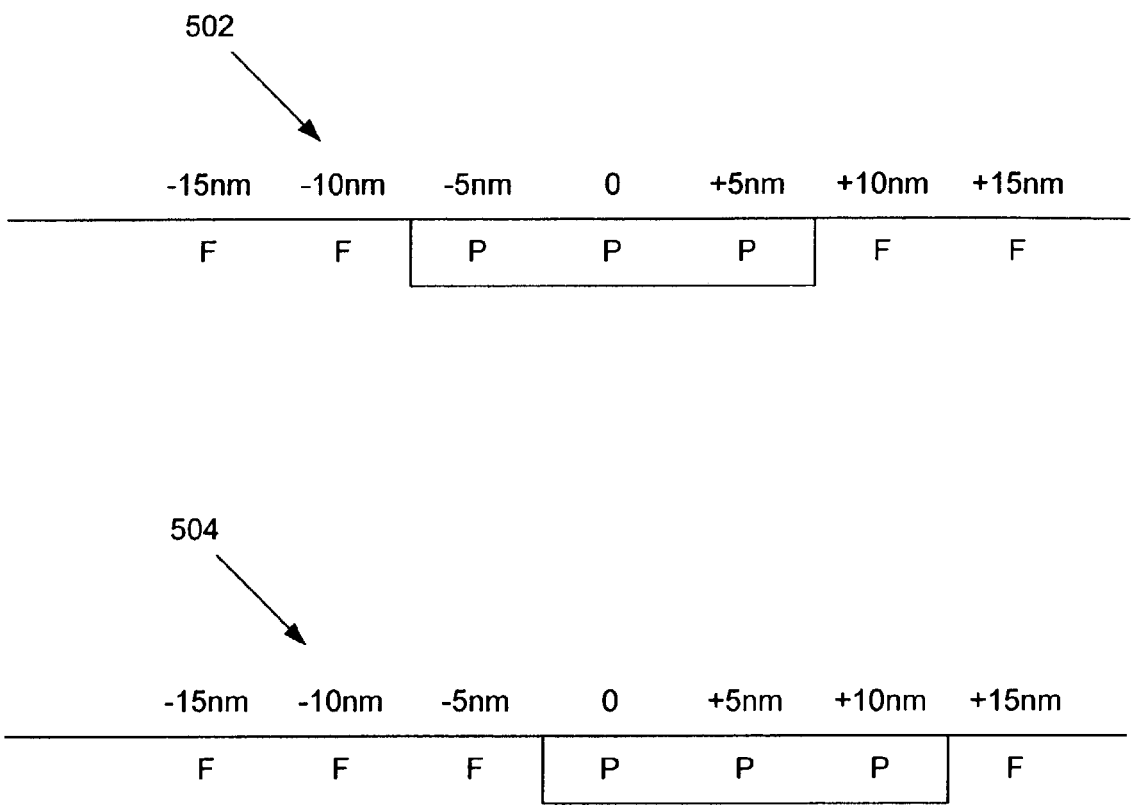
FIG. 5 illustrates example pass/fail maps for the arrays.

FIG. 4 is a flowchart illustrating a preferred embodiment of a method for calibrating failures in semiconductor memory devices due to contact mask misalignment in accordance with the present invention. First, a contact mask with a plurality of known offsets is provided, via step 402. In the preferred embodiment, a different offset is provided for each array 306–318 of devices on the die. Next, a plurality of contacts 320–332 is created on the die using the contact mask, via step 404. Then, it is determined which devices on the die fail, via step 406. In the preferred embodiment, a parameter(s) of the devices of each array 306–318 is measured to determine if the device passes or fails a minimum requirement. The parameter may include leakage, bit failure, charge loss, etc.

From this data, a pass/fail map is created for the devices, via step 408. FIG. 5 illustrates an example pass/fail map 502 for the arrays 306–318. According to the map 502, the devices in arrays 310–314 pass, while the devices in arrays 306–308 and 316–318 fail. From the pass/fail map 502, the range of allowed mask misalignment and the amount of mask misalignment are determined for passing devices, via step 410.

More arrays of devices can then be created on a second die using the same process and the same contact mask. Another pass/fail map can be created for these devices, according to the method described above. FIG. 5 illustrates an example of this second pass/fail map 504. The second pass/fail map 504 can be compared with the first pass/fail map 502. Assuming that the first pass/fail map 504 had no misalignment of the contact mask, the comparison shows that the range of passing devices has shifted by +5 nm. This indicates that the contact mask was misaligned by +5 nm. In this manner, the amount of misalignment of a contact mask can be ascertained.

The same type of comparison can be made in understanding the effects of a stress on the test structures. The test structures can be subjected to various stresses, such as voltage stress. The parameters are then re-measured for the arrays, and a new pass/fail map created. By determining how the range of passing devices has shifted in the new pass/fail map, a better understanding of the effects of the stress is obtained.

With the information that can be gathered using the test structures in accordance with the present invention, the effects of contact mask misalignment can be better understood, and the manufacturing process designs can be changed accordingly.

Similar test structures may also be used to better understand the effects of other types of defects. For example, the critical dimensions, or sizes, of the contacts 316–324 may be intentionally varied in a known way to determine the effects of varying critical dimension defects on device performance. The critical dimensions of other features may also be varied, such as for the polysilicon layers 106 or 112 and for the active regions 18.

Test structures with intentional defects can also be used to assist in finding other defects on a die. Currently, a die is first scanned by an optical defect inspection tool to locate defects. Then, a Scanning Electron Microscope (SEM) tool is used to examine these defects. However, there is a location offset between these two tools. If the die has one or more large defects that the SEM can easily see, this large defect is used as a reference. The offset between the two tools can then be determined, and the smaller defects can be located using this offset. However, if the die does not have any defects large enough for the SEM to easily see, there is no reference, and the offset cannot be determined. The smaller defects are then difficult to locate.

To address this problem, a test structure with intentional defects can be created on the die, with the test structure being large enough for the SEM tool to easily locate. The test structure can be placed in an open periphery area on the die. The defects of this test structure are located by the optical defect inspection tool. The SEM tool can then use this test structure as the reference and determine the location offset with the optical defect inspection tool. The smaller defects can then be located by the SEM tool using this offset.

A method and apparatus for calibrating failures in semiconductor memory devices due to contact mask misalignment have been disclosed. The method and apparatus intentionally misalign the contact mask for each array of memory devices on a die in known amounts. A pass/fail map can then be created for the arrays. This map can be used to determine the range of allowed misalignment and the amount of misalignment, providing a better understanding of how contact mask misalignment affects the yield and reliability of the memory devices. The pass/fail map may also be used for comparison with a pass/fail map created after the arrays have been subjected to a known stress. Similar test structures with intentional defects can be used to better understand the effects of other defects, such as varying critical dimensions of different features of the devices. A test structure with intentional defects can also be created on a die as a reference for determining the location offset between an optical defect inspection tool and a SEM tool. The locations of small defects on the die can then be more easily located by the SEM tool.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for calibrating failures in semiconductor memory devices due to contact mask misalignment, comprising the steps of:
    (a) providing a first plurality of semiconductor memory devices on a first die;
    (b) providing a contact mask with a plurality of known offsets;
    (c) creating a first plurality of contacts on the first die using the contact mask;
    (d) determining which of the first plurality of semiconductor memory devices on the first die fail; and
    (e) creating a first pass/fail map for the first plurality of semiconductor memory devices.

2. The method of claim 1, wherein the determining step (d) comprises:
    (d1) measuring a parameter for each of the first plurality of semiconductor memory devices on the first die.

3. The method of claim 2, wherein the parameter comprises one or more of the group consisting of:
    charge leakage;
    charge loss; and
    bit failure.

4. The method of claim 1, further comprising:
    (f) determining a range of contact mask misalignment allowed for passing semiconductor memory devices on the first die using the first pass/fail map.

5. A method for calibrating failures in semiconductor memory devices due to contact mask misalignment, comprising the steps of:
    (a) providing a plurality of semiconductor memory devices on a die;
    (b) providing a contact mask with a plurality of known offsets;
    (c) creating a plurality of contacts on the die using the contact mask;
    (d) determining which of the plurality of semiconductor memory devices on the die fail;

(e) creating a first pass/fail map for the plurality of semiconductor memory devices; and
(f) determining a range of contact mask misalignment allowed for passing semiconductor memory devices using the first pass/fail map.

6. A method for calibrating failures in semiconductor memory devices due to contact mask misalignment, comprising the steps of:
(a) providing a plurality of semiconductor memory devices on a die;
(b) providing a contact mask with a plurality of known offsets;
(c) creating a plurality of contacts on the die using the contact mask;
(d) determining which of the plurality of semiconductor memory devices on the die fail;
(e) creating a first pass/fail map for the plurality of semiconductor memory devices;
(f) subjecting the plurality of semiconductor memory devices on the die to a known stress;
(g) creating a second pass/fail map for the devices after subjecting the plurality of semiconductor memory devices to the known stress; and
(h) comparing the second pass/fail map with the first pass/fail map.

7. A method for calibrating failures in semiconductor memory devices due to contact mask misalignment, comprising the steps of:
(a) providing a first plurality of semiconductor memory devices on a first die;
(b) providing a contact mask with a plurality of known offsets;
(c) creating a first plurality of contacts on the first die using the contact mask;
(d) determining which of the first plurality of semiconductor memory devices on the first die fail;
(e) creating a first pass/fail map for the first plurality of semiconductor memory devices;
(f) creating a second plurality of contacts on a second die using the contact mask;
(g) determining which of a second plurality of semiconductor memory devices on the second die fail;
(h) creating a second pass/fail map for the second plurality of semiconductor memory devices on the second die; and
(i) comparing the second pass/fail map with the first pass/fail map to determine an amount of misalignment of the contact mask.

* * * * *